(12) United States Patent
Cui et al.

(10) Patent No.: US 12,306,545 B2
(45) Date of Patent: May 20, 2025

(54) DETERMINING LITHOGRAPHIC MATCHING PERFORMANCE

(71) Applicant: ASML NETHERLANDS B.V., Veldhoven (NL)

(72) Inventors: Yingchao Cui, Eindhoven (NL); Hadi Yagubizade, Eindhoven (NL); Xiuhong Wei, Eindhoven (NL); Daan Maurits Slotboom, Wolphaartsdijk (NL); Jeonghyun Park, Eindhoven (NL); Sarathi Roy, Eindhoven (NL); Yichen Zhang, Eindhoven (NL); Mohammad Reza Kamali, Eindhoven (NL); Sang Uk Kim, Yong-In (KR)

(73) Assignee: ASML NETHERLANDS B.V., Veldhoven (NL)

( * ) Notice: Subject to any disclaimer, the term of this patent is extended or adjusted under 35 U.S.C. 154(b) by 549 days.

(21) Appl. No.: 17/640,880

(22) PCT Filed: Aug. 11, 2020

(86) PCT No.: PCT/EP2020/072473
§ 371 (c)(1),
(2) Date: Mar. 7, 2022

(87) PCT Pub. No.: WO2021/047841
PCT Pub. Date: Mar. 18, 2021

(65) Prior Publication Data
US 2022/0334503 A1 Oct. 20, 2022

(30) Foreign Application Priority Data

Sep. 12, 2019 (EP) .................................... 19196849
Sep. 20, 2019 (EP) .................................... 19198515
Mar. 27, 2020 (EP) .................................... 20166146

(51) Int. Cl.
*G03F 7/00* (2006.01)

(52) U.S. Cl.
CPC ...... *G03F 7/70633* (2013.01); *G03F 7/70525* (2013.01)

(58) Field of Classification Search
CPC ............... G03F 7/7045; G03F 7/70525; G03F 7/70633; G03F 7/70458; G03F 7/70616
See application file for complete search history.

(56) References Cited

U.S. PATENT DOCUMENTS 6,304,999 B1 * 10/2001 Toprac ............. G05B 19/41865
700/121
6,340,547 B1 * 1/2002 Chen ................... G03F 7/70458
430/30

(Continued)

FOREIGN PATENT DOCUMENTS

EP      3 364 247      8/2018
KR    2004-0075558    8/2004

(Continued)

OTHER PUBLICATIONS

Office Action issued in corresponding Chinese Patent Application No. 202080064062, dated Feb. 19, 2024.

(Continued)

*Primary Examiner* — Deoram Persaud
(74) *Attorney, Agent, or Firm* — Pillsbury Winthrop Shaw Pittman, LLP

(57) ABSTRACT

A method for determining lithographic matching performance includes obtaining first monitoring data from recurrent monitoring for stability control for an available EUV scanner. For a DUV scanner, second monitoring data is similarly obtained from recurrent monitoring for stability control. The EUV first monitoring data are in a first layout. The DUV second monitoring data are in a second layout. A cross-platform overlay matching performance between the first lithographic apparatus and the second lithographic apparatus is determined based on the first monitoring data (Continued)

and the second monitoring data. This is done by reconstructing the first and/or second monitoring data into a common layout to allow comparison of the first and second monitoring data.

20 Claims, 9 Drawing Sheets

(56) References Cited

U.S. PATENT DOCUMENTS

| | | | |
|---|---|---|---|
| 6,952,253 | B2 | 10/2005 | Lof et al. |
| 10,627,729 | B2* | 4/2020 | Schmitt-Weaver ... G03F 9/7019 |
| 11,774,862 | B2* | 10/2023 | Cekli .................. G01N 21/956 356/399 |
| 11,940,740 | B2* | 3/2024 | Ypma .................. G03F 7/70525 |
| 2002/0111038 | A1* | 8/2002 | Matsumoto ......... G03F 7/70633 438/763 |
| 2004/0207824 | A1 | 10/2004 | Lof et al. |
| 2008/0057418 | A1* | 3/2008 | Seltmann ............ G03F 7/70633 430/30 |
| 2008/0128642 | A1* | 6/2008 | Mos .................... G03F 7/70525 250/492.22 |
| 2008/0294280 | A1* | 11/2008 | Okita ................. G03F 7/70525 257/E21.627 |
| 2009/0168034 | A1* | 7/2009 | Staecker ............. G03F 7/70633 355/46 |
| 2010/0028790 | A1* | 2/2010 | Seltmann ............ G03F 7/70525 430/30 |
| 2010/0185311 | A1* | 7/2010 | Hsieh ................. G03F 7/70458 700/121 |
| 2011/0216294 | A1* | 9/2011 | Menchtchikov .... G03F 7/70258 355/53 |
| 2012/0218533 | A1 | 8/2012 | Lyulina et al. |
| 2012/0244461 | A1* | 9/2012 | Nagai ................. G03F 7/70633 430/30 |
| 2013/0230797 | A1* | 9/2013 | Van Der Sanden ........................ G03F 7/70616 430/30 |
| 2014/0168620 | A1 | 6/2014 | Schmitt-Weaver et al. |
| 2018/0356736 | A1 | 12/2018 | Danilin |
| 2019/0129315 | A1 | 5/2019 | Tarabrin et al. |
| 2020/0278614 | A1 | 9/2020 | Werkman et al. |
| 2022/0171295 | A1* | 6/2022 | Meijerink ........... G03F 7/70725 |
| 2022/0291590 | A1* | 9/2022 | Su ....................... G03F 7/70633 |
| 2022/0334500 | A1* | 10/2022 | Yagubizade ........ G03F 7/70508 |
| 2023/0108481 | A1* | 4/2023 | Ten Berge .............. H01L 24/80 355/67 |
| 2023/0341783 | A1* | 10/2023 | Hubaux .............. G03F 7/70633 |

FOREIGN PATENT DOCUMENTS

| | | |
|---|---|---|
| TW | 201931021 | 8/2019 |
| TW | 201935138 | 9/2019 |
| WO | 2019110238 | 6/2019 |

OTHER PUBLICATIONS

Office Action issued in corresponding Korean Patent Application No. 10-2022-7008294, dated Feb. 18, 2024.
International Search Report and Written Opinion issued in corresponding PCT Patent Application No. PCT/EP2020/072473, dated Nov. 18, 2020.
Taiwanese office Action issued in corresponding Taiwanese Patent Application No. 109129985, dated Jun. 30, 2021.
DeMoor, S. et al.: "Scanner Overlay Mix and Match Matrix Generation: Capturing All Sources of Variation" Proc. of SPIE, vol. 5375 (May 2004).

* cited by examiner (a)

(b)

DETERMINING LITHOGRAPHIC MATCHING PERFORMANCE

CROSS-REFERENCE TO RELATED APPLICATIONS

This application is the U.S. national phase entry of PCT Patent Application No. PCT/EP2020/072473 which was filed on Aug. 11, 2020, which claims the benefit of priority of European Patent Application No. 19196849.4 which was filed on Sep. 12, 2019, of European Patent Application No. 19198515.9 which was filed on Sep. 20, 2019 and of European Patent Application No. 20166146.9 which was filed on Mar. 27, 2020 which are incorporated herein in their entireties by reference.

FIELD

The present invention relates to methods of determining lithographic matching performance between lithographic apparatuses for semiconductor manufacture, a semiconductor manufacturing processes, a lithographic apparatus, a lithographic cell and associated computer program products.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm deep ultraviolet (DUV), 193 nm deep ultraviolet (DUV) and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a DUV lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

Cross-platform, for example DUV to EUV, matching performance between lithographic apparatuses is vital for on-product overlay performance. Conventionally, this is achieved using a dedicated verification test. This test requires certain machine setup procedure as a pre-requisite that takes hours of time. Extra scanner and metrology time is required for pre-setup, exposure and overlay measurement. The test is performed only when it is very necessary and therefore cannot be used for daily monitoring purposes, which is necessary for high-volume manufacturing.

SUMMARY

It is desirable to provide a method of determining lithographic matching performance between lithographic apparatuses that solves the above-discussed problem.

Embodiments of the invention are disclosed in the claims and in the detailed description.

In a first aspect of the invention there is provided a method of determining lithographic matching performance between lithographic apparatuses for semiconductor manufacturing, the method comprising:
  obtaining first monitoring data in a first layout from recurrent monitoring for stability control of a first lithographic apparatus;
  obtaining second monitoring data in a second layout from recurrent monitoring for stability control of a second lithographic apparatus; and
  determining a lithographic matching performance between the first lithographic apparatus and the second lithographic apparatus based on the first monitoring data and the second monitoring data, wherein the determining comprises reconstructing at least one of the first and second monitoring data into a common layout to allow comparison of the first and second monitoring data.

In a second aspect of the invention there is provided a semiconductor manufacturing process comprising a method for determining lithographic matching performance according to the first aspect.

In a third aspect of the invention there is provided a lithographic apparatus comprising:
  an illumination system configured to provide a projection beam of radiation;
  a support structure configured to support a patterning device, the patterning device configured to pattern the projection beam according to a desired pattern;
  a substrate table configured to hold a substrate;
  a projection system configured the project the patterned beam onto a target portion of the substrate; and
  a processing unit configured to determine lithographic matching performance according to the method of the first aspect.

In a fourth aspect of the invention there is provided a lithographic cell comprising the lithographic apparatus of the third aspect.

In a fifth aspect of the invention there is provided a computer program product comprising machine readable instructions for causing a general-purpose data processing apparatus to perform the steps of a method according to the first aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
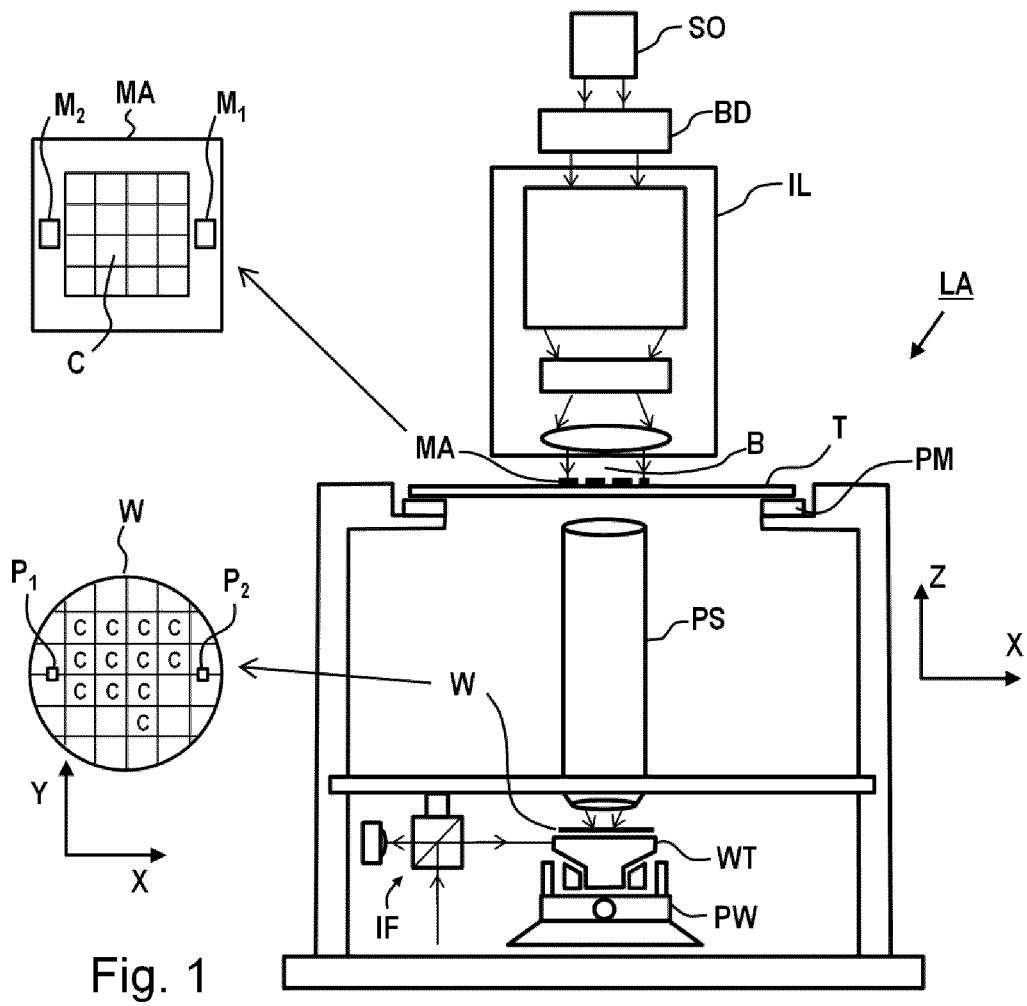
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
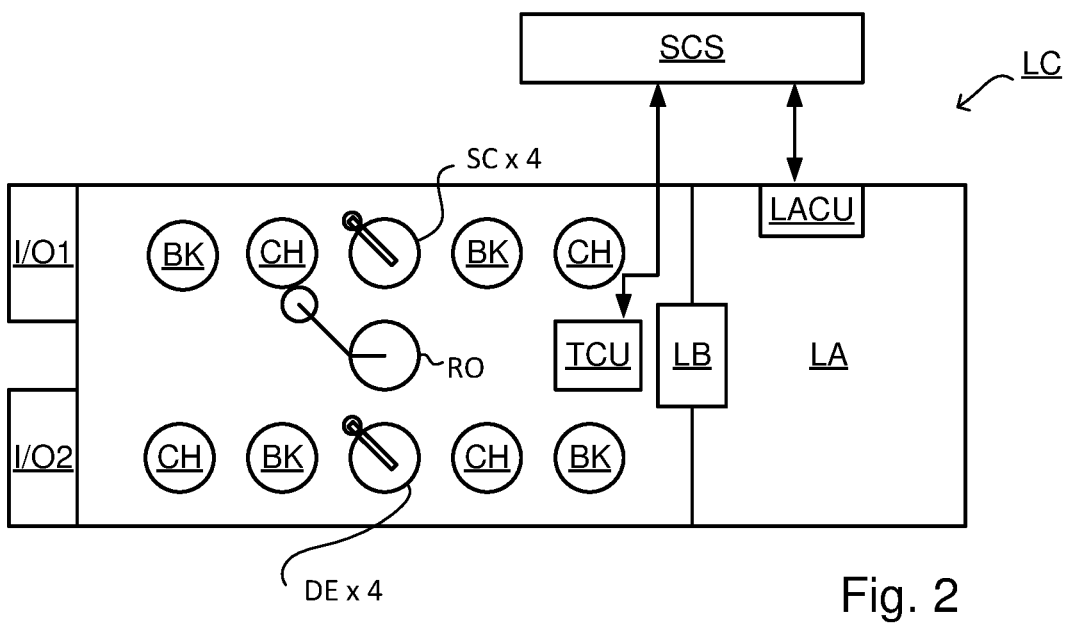
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, 1/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
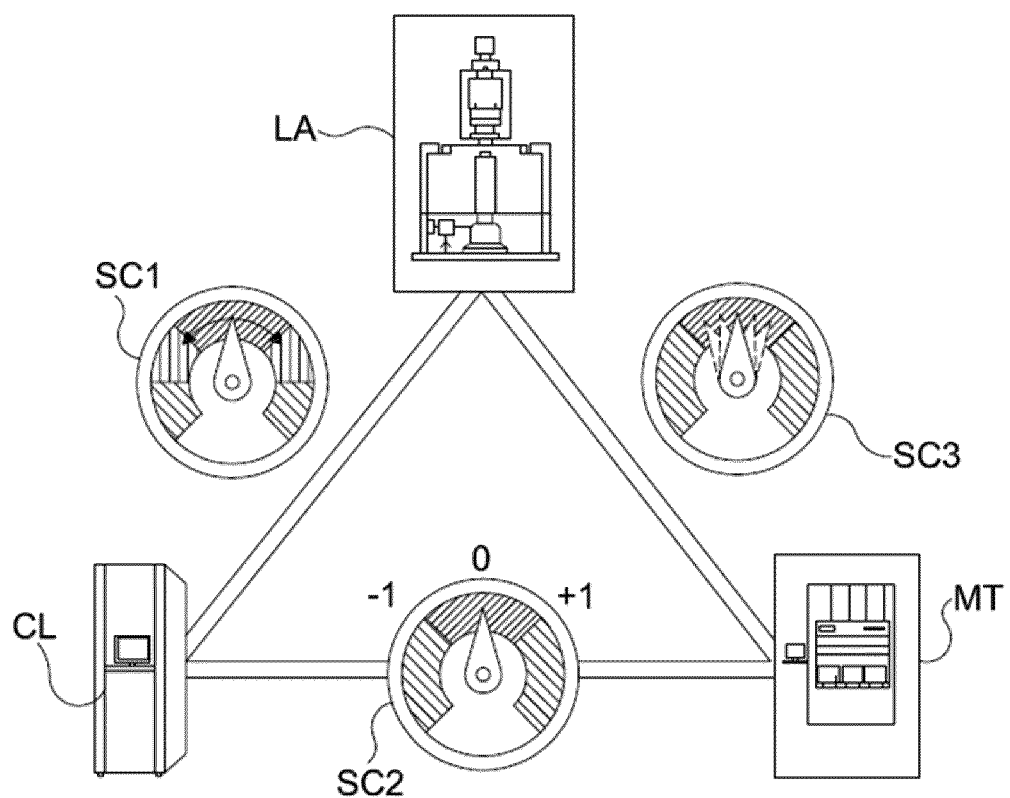
FIG. 3 depicts a schematic representation of holistic lithography, representing a cooperation between three key technologies to optimize semiconductor manufacturing.

Typically, the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4:
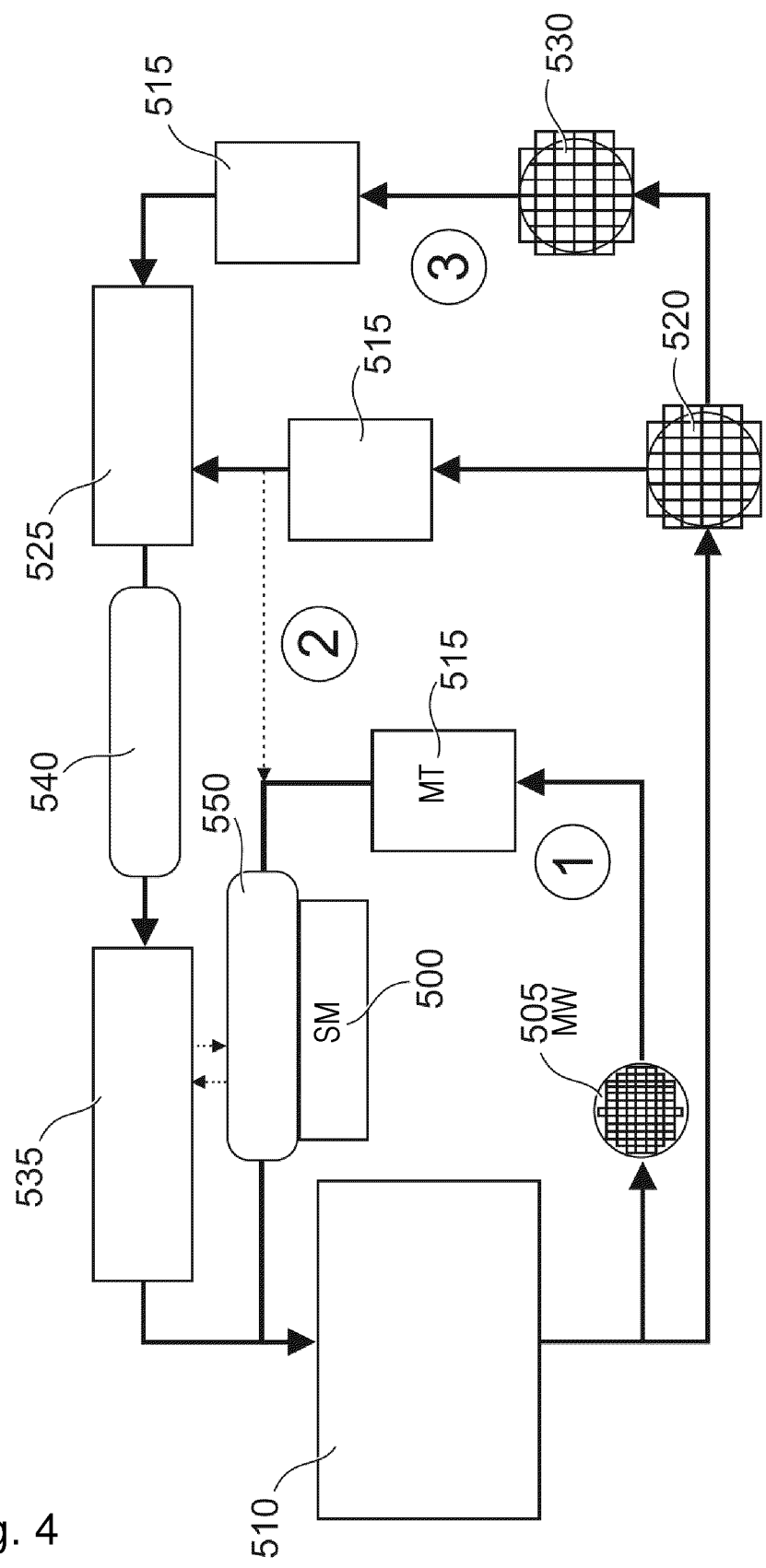
FIG. 4 is a schematic overview of control mechanisms in a lithographic process utilizing a scanner stability module.

FIG. 4 depicts the overall lithography and metrology method incorporating a stability module 500 (essentially an application running on a server, in this example). Shown are three main process control loops, labeled 1, 2, 3. The first loop provides recurrent monitoring for stability control of the lithography apparatus using the stability module 500 and monitor wafers. A monitor wafer (MW) 505 is shown being passed from a lithography cell 510, having been exposed to set the baseline parameters for focus and overlay. At a later time, metrology tool (MT) 515 reads these baseline parameters, which are then interpreted by the stability module (SM) 500 so as to calculate correction routines so as to provide scanner feedback 550, which is passed to the main lithography apparatus 510, and used when performing further exposures. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in the metrology tool.

The second (APC) loop is for local scanner control on-product (determining focus, dose, and overlay on product wafers). The exposed product wafer 520 is passed to metrology unit 515 where information relating for example to parameters such as critical dimension, sidewall angles and overlay is determined and passed onto the Advanced Process Control (APC) module 525. This data is also passed to the stability module 500. Process corrections 540 are made before the Manufacturing Execution System (MES) 535 takes over, providing control of the main lithography apparatus 510, in communication with the scanner stability module 500.

The third control loop is to allow metrology integration into the second (APC) loop (e.g., for double patterning). The post etched wafer 530 is passed to metrology unit 515 which again measures parameters such as critical dimensions, sidewall angles and overlay, read from the wafer. These parameters are passed to the Advanced Process Control (APC) module 525. The loop continues the same as with the second loop.

Figure 5:
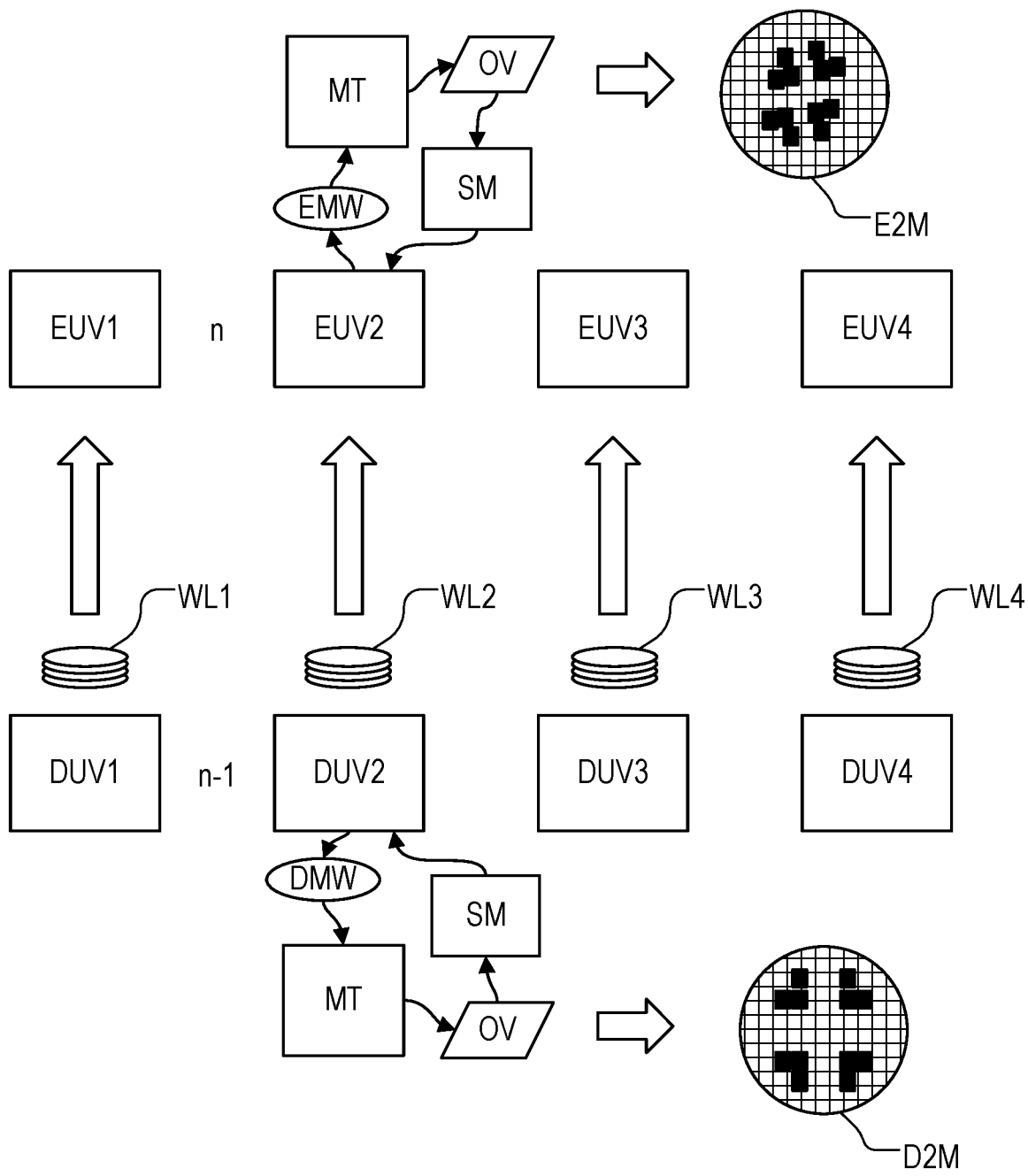
FIG. 5 depicts a schematic overview of normal operation of a set of DUV and EUV lithographic apparatuses with recurrent monitoring for stability control.

FIG. 5 depicts a schematic overview of normal operation of a set of lithographic apparatuses with recurrent monitoring for stability control. In the examples given below, the lithographic apparatuses are scanners. Four deep UV scanners DUV1 to DUV4 are shown having processed four wafer lots WL1 to WL4 at a lithographic exposure step n−1. These wafer lots are then processed in the next lithographic exposure step n in four extreme UV scanners EUV1 to EUV4. The wafer lots have dedicated routes. For example a wafer lot WL1 exposed in a deep UV scanner DUV1 and then exposed in an extreme UV scanner EUV1.

Each scanner has a process for recurrent monitoring for stability control, as described with reference to FIG. 4. Monitoring data are obtained by measuring one or more monitoring substrates periodically processed on the respective lithographic apparatus. In FIG. 5, for example, an extreme UV Scanner EUV2 processes a monitor wafer EMW which is measured in a metrology tool MW which outputs overlay measurements OV to a stability module SM. The overlay measurements OV are recorded as an wafer map E2M comprising a grid of overlay measurements (which may be represented as overlay residuals). Thus, first monitoring data E2M is obtained from recurrent monitoring for stability control of a first lithographic apparatus EUV2. The first monitoring data E2M are in a first layout. For example, each datum has a particular location on the substrate where it was measured. Also, depicted in this example, a deep UV scanner DUV2 processes a monitor wafer DMW which is measured in a metrology tool MW which outputs overlay measurements OV to a stability module SM. The overlay measurements OV are recorded as an wafer map D2M comprising a grid of overlay measurements. Thus, second monitoring data D2M is obtained from recurrent monitoring for stability control of a second lithographic apparatus DUV2. The second monitoring data D2M are in a second layout, different from the first layout. This difference comes from different layout and density of the features on the monitor wafers EMW and DMW and differences in the sample schemes for overlay measurement. This is to be expected with different platforms such as DUV and EUV.

Figure 6:
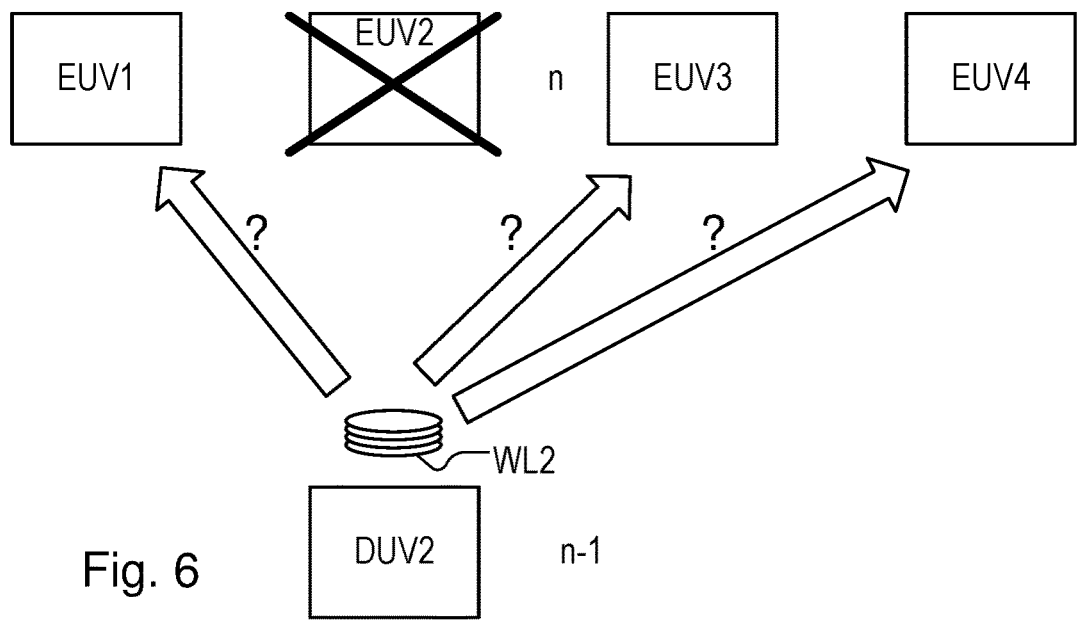
FIG. 6 depicts the problem of unavailability of a lithographic apparatus, necessitating cross-platform lithographic matching.

FIG. 6 depicts the problem of unavailability of a lithographic apparatus, necessitating cross-platform lithographic matching. Selected scanners are shown from FIG. 5. One of the EUV scanners EUV2 is not available for production, perhaps because it is down for preventive maintenance. Therefore, the question arises: Where should the wafer lot WL2 from the second DUV scanner DUV2 be processed next? Which of the available EUV scanners EUV1, EUV3 or EUV4 should be used? The answer can be found by determining which of the EUV scanners has the best overlay matching performance with the DUV scanner DUV2.

Figure 7:
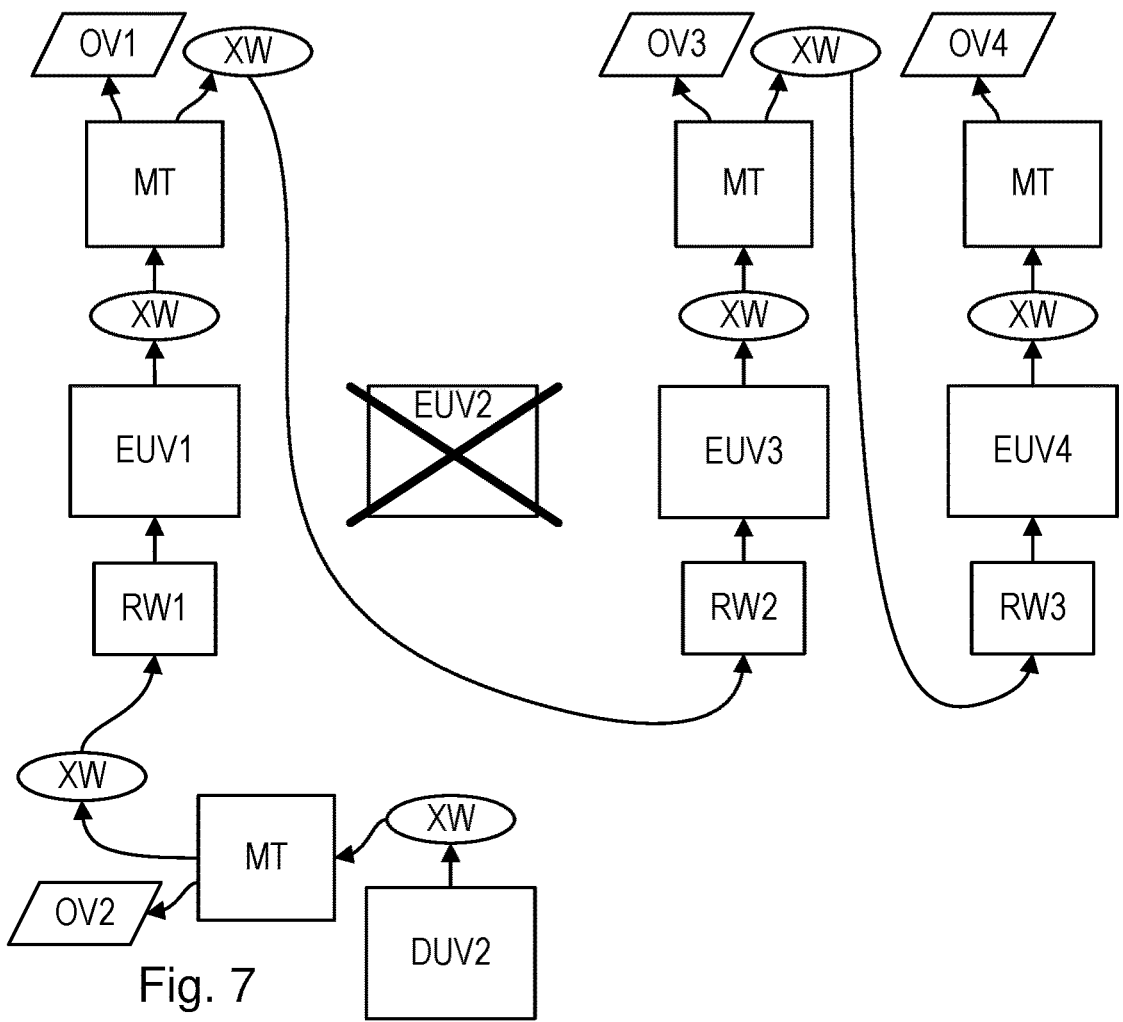
FIG. 7 depicts a test for determining cross-platform lithographic matching performance using a conventional approach.

FIG. 7 depicts determining cross-platform lithographic matching performance using a conventional approach. A cross-platform test wafer XW is exposed on the second DUV scanner DUV2 and metrology tool MT measures the overlay OV2. The test wafer XW is reworked RW1 and exposed in the first EUV tool EUV1. Next, the metrology tool MT measures the overlay OV1. The test wafer XW is reworked RW2 and exposed in the third EUV tool EUV3. The metrology tool MT then measures the overlay OV3. Finally, The test wafer XW is reworked RW3 and exposed in the fourth EUV tool EUV4. The metrology tool MT then measures the overlay OV4. The cross-platform overlay matching performance between the second DUV scanner DUV2 and the first EUV scanner EUV1 is determined by calculating the difference between the respective overlay measurements OV2 and OV1. This is repeated for each of the remaining EUV scanners (i.e. OV2-OV3 and OV2-OV4). The differences are ranked and the EUV scanner with the smallest difference is determined to have the best overlay matching performance. Then the wafer lot WL2 is routed through that scanner. The dedicated verification test described with reference to FIG. 7 requires a scanner setup procedure as a pre-requisite that takes hours of time. It is performed only when it is very necessary and therefore cannot be used for daily monitoring purposes, which is necessary for a high-volume manufacturing environment.

Embodiments provide a methodology to determine the cross-platform matching performance using the outputs from recurrent monitoring for stability control (drift control, DC).

Figure 8:
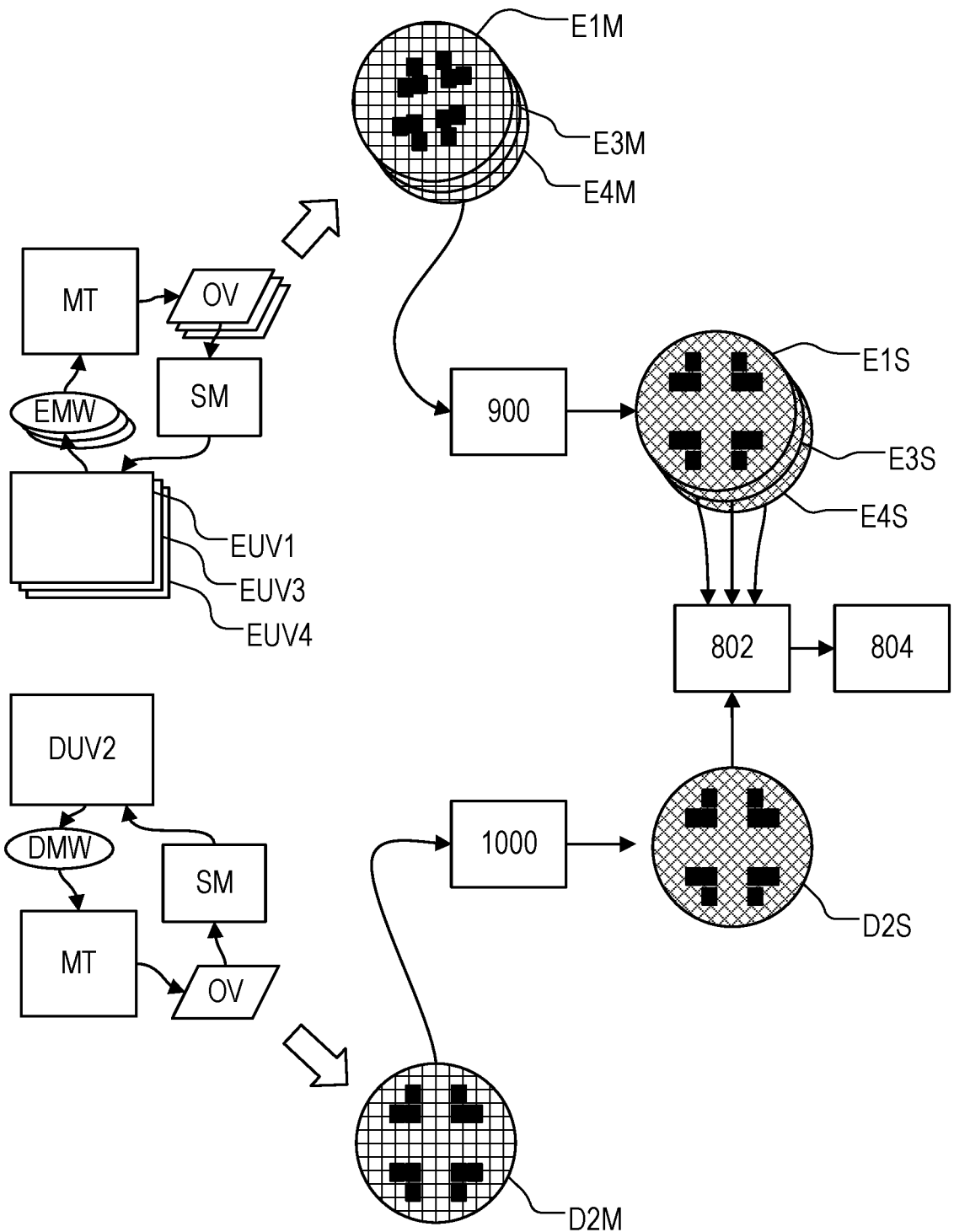
FIG. 8 depicts an overview of a method of determining lithographic matching performance between lithographic apparatuses, according to an embodiment of the present invention.

FIG. 8 depicts an overview of a method of determining lithographic matching performance between lithographic apparatuses for semiconductor manufacture.

First monitoring data E1M, E3M, E4M is obtained from recurrent monitoring (by monitor wafer EMW, metrology tool MT, overlay measurements OV, and stability module SM) for stability control for the available EUV scanners EUV1, EUV3 and EUV4. For the second DUV scanner, second monitoring data D2M is similarly obtained from recurrent monitoring (DMW, MT, OV, SM) for stability control. The EUV monitoring data E1M, E3M, E4M are in a first layout. The DUV monitoring data D2M are in a second layout.

The DUV monitoring data D2M is preferably chosen to have the same (or close to the same, such as the same day) exposure time that the wafer lot in question was exposed at for layer n−1. It will better reflect the overlay performance of that DUV scanner which is desired to be matched, for that wafer lot. Thus, for example with reference to FIGS. 5 and 8, consider the matching of scanner DUV2 to one of the EUV scanners EUV1,3,4. For routing of a wafer lot WL2 with bottom layer n−1 exposed at a time t~$T_0$ on DUV scanner DUV2, one of the EUV scanners EUV1,3,4 is selected based on monitoring data D2M for which the DUV monitoring wafer DMW was also exposed at time t~$T_0$. That monitoring data is compared to current EUV monitoring data, the match is determined, and the EUV processing step proceeds as soon as possible, before the selected EUV scanner's performance drifts. Thus, the first monitoring data D2M is obtained from exposures of the one or more monitoring substrates that were contemporaneous (t~$T_0$) with exposure of the wafer lot (one or more substrate) WL2 to be exposed in the second lithographic apparatus EUV1,3,4 depending on the determination of the lithographic matching performance.

Cross-platform overlay matching performance between the first lithographic apparatuses EUV1, EUV3, EUV4 and the second lithographic apparatus DUV2 is determined based on the first monitoring data and the second monitoring data. This may be done by reconstructing 900, 1000 (as described with reference to FIGS. 9 and 10) at least one of the first and second monitoring data into a common layout (e.g. a simulated wafer map) E1S, E3S, E4S, D2S to allow comparison 802 of the first and second monitoring data.

The cross-platform overlay matching performance between the second DUV scanner DUV2 and the first EUV scanner EUV1 is determined by calculating 802 the difference between the respective monitoring data in the common layout D2S and E2S. This is repeated for each of the remaining EUV scanners (i.e. D2S-E3S and D2S-E4S). The differences are ranked 804 and the EUV scanner with the smallest difference is determined to have the best overlay matching performance. Then the wafer lot WL2 from the second DUV scanner DUV2 is routed through that EUV scanner.

Figure 9:
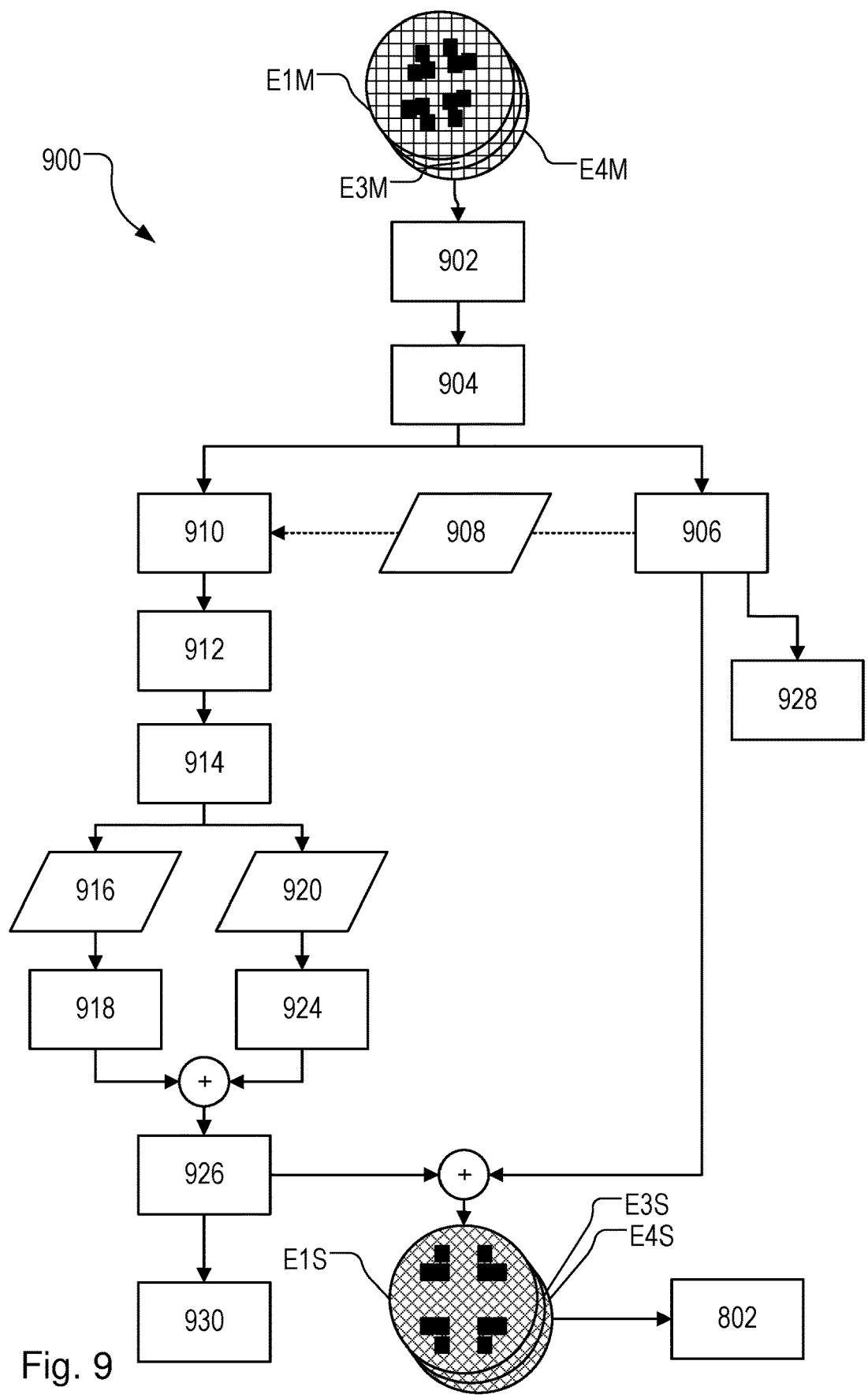
FIG. 9 depicts processing of EUV monitoring data for determining lithographic matching performance with reconstruction of monitoring data, according to an embodiment of the present invention.

FIG. 9 depicts processing 900 of EUV monitoring data for determining lithographic matching performance with reconstruction of monitoring data.

Figure 10:
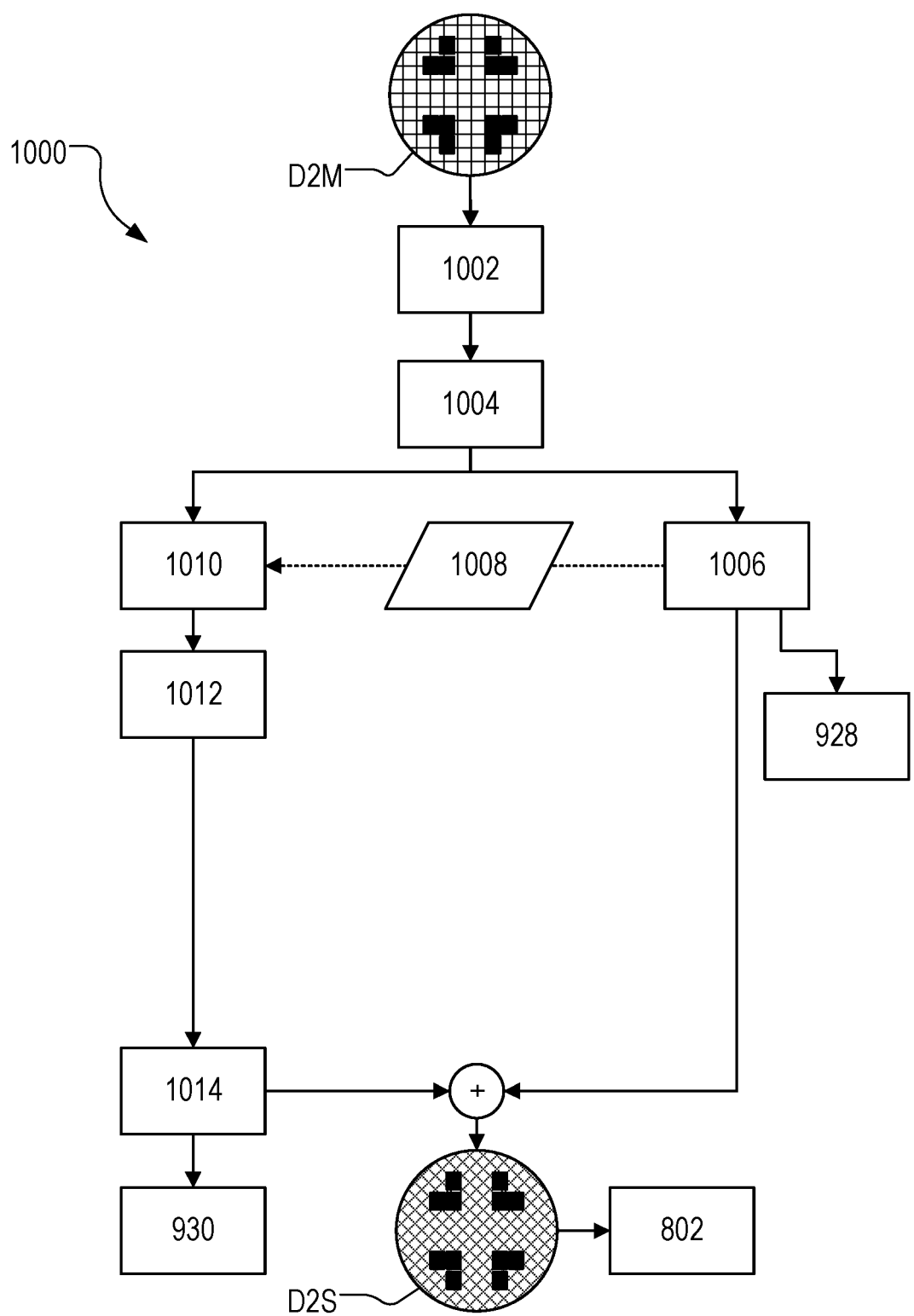
FIG. 10 depicts processing of DUV monitoring data for determining lithographic matching performance, according to an embodiment of the present invention.

FIG. 10 depicts processing 1000 of DUV monitoring data for determining lithographic matching performance.

With reference to FIGS. 9 and 10, densely-sampled intra-field data are processed separately 906, 1006 from inter-field (whole-wafer) data for the EUV and DUV monitoring data respectively. In this example this includes decomposing inter-field and intra-field data, but in other examples the raw inter-field and intra-field data may already be separated so decomposition is not needed. These intra-field data correspond to a lithographic exposure field with the same sampling same layout, i.e. 13×19 points per field. Direct subtraction is performed to calculate the intra-field matching fingerprint (i.e. the cross-field pattern). For the inter-field fingerprint matching for the EUV monitoring data, the inter-field components of wafer maps E1M, E3M and E4M are re-constructed (as detailed with reference to FIG. 9) into a common layout E1S, E3S and E4S. With reference to FIGS. 8 to 10, a conventional cross-platform test wafer layout is used as an example common layout. But in practice, other common layouts can be selected to achieve a good accuracy. Finally, the intra-field data is added back to inter-field data, then a complete wafer map is ready for comparison to determine the lithographic matching performance.

With reference to FIG. 9, for EUV, starting from the monitoring data E1M, E3M, E4M (described with reference to FIG. 8), filtering and modeling is applied 902, including wafer error correction and reticle error correction. Then the data is split 904 into chuck 1 and chuck 2 data (as these scanners have two wafer chucks to support the wafers during exposure). The monitoring data comprise inter-field data (fingerprint) corresponding to a plurality of lithographic exposure fields. The monitoring data also comprise intra-field data corresponding to a lithographic exposure field. The intra-field average fingerprint 908 is calculated 906. For each chuck, the intra-field average fingerprint is removed 910 from the whole-wafer inter-field data. The field average fingerprint 908 used here can be calculated from dense fields (e.g. configured to minimize a quadratic component of overlay, induced by lens distortion) or average of all inner fields, including dense fields and sparse sampled fields. Then all the wafers from the same chuck are averaged 912. Afterwards, a high order global model and another additional model, e.g. wafer-edge model, are applied 914 to the wafer map. Thus the step of reconstructing comprises fitting the respective monitoring data to a (global) model of a lithographic process of the respective lithographic apparatus to predict reconstructed monitoring data in the common layout. The models here are used to capture physical fingerprints on the wafer map. Residuals of these model contains mainly noise errors other than the physical fingerprint. The model parameters (correctable errors) 920 are mapped 924 to the selected common layout. Thus the step of reconstructing further comprises mapping fitted parameters of the model to the common layout. For the residual (non-correctable errors) 916, interpolation 918 is used to map it to the same common layout. Linear or other type of interpolation may be used. Thus the step of reconstructing further comprises interpolating residuals from the fitting to the common layout. The correctable errors and non-correctable errors (now mapped/interpolated the common layout) are added together to provide the monitoring data 926 in the common layout E1S, E3S, E4S. Thus the separately processed inter-field and intra-field data are combined to allow comparison of the first and second monitoring data in a common layout. Then the monitoring data re-construction for the inter-field data is complete. Finally a comparison 802 is performed to determine the lithographic matching performance (as described with reference to step 802 in FIG. 8).

With reference to FIG. 10, For DUV, the flow is different in this example because the monitoring data contains multiple images with different exposure layouts. Starting from monitoring data D2M (described with reference to FIG. 8), filtering and modeling is applied 1002 and the data is split 1004 per chuck, in the same was same as for EUV, described with reference to FIG. 9. For the intra-field fingerprint matching, the dense fields are also used by calculating 1006 an intra-field average fingerprint 1008. To get an inter-field fingerprint, the intra-field average fingerprint (dense field) per image and per wafer is removed 1010, an average of all the wafer per image is performed 1012, and then all images are averaged 1014. In the end, the intra-field average fingerprint calculated 1006 from dense fields can be added back for a complete simulated wafer map DS2. Finally a comparison 802 is performed to determine the lithographic matching performance.

After all these flows, the monitoring data wafer maps from EUV and DUV are now in the same layout, and matching performance can be calculated 802 using direct subtraction to calculate differences (as described with reference to step 802 in FIG. 8). The differences are ranked 804 (as described with reference to step 802 in FIG. 8) and the EUV scanner with the lowest difference is determined to have the best overlay matching performance. Then the wafer lot WL2 from the second DUV scanner DUV2 is routed through that EUV scanner.

Additionally or alternatively, ranking may be performed by comparison 928 (also in FIG. 9) of the intra-field average fingerprints 908 and 1008. This can be used for scanner-to-scanner lens matching. Similarly, additionally or alternatively, ranking may be performed by comparison 930 (also in FIG. 9) of the inter-field reconstructed monitoring data.

Figure 11:
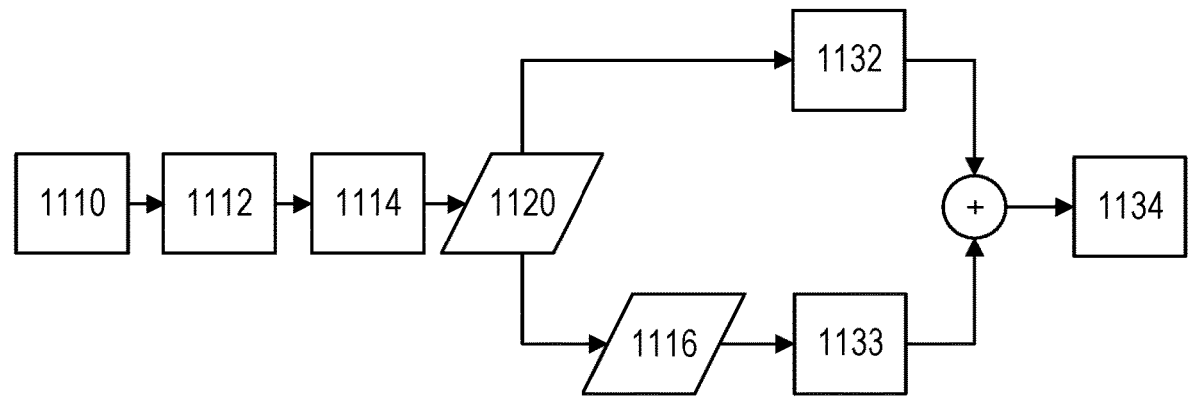
FIGS. 11(a) and 11(b) depict a method for mapping field-to-field variation terms.
Figure 11:
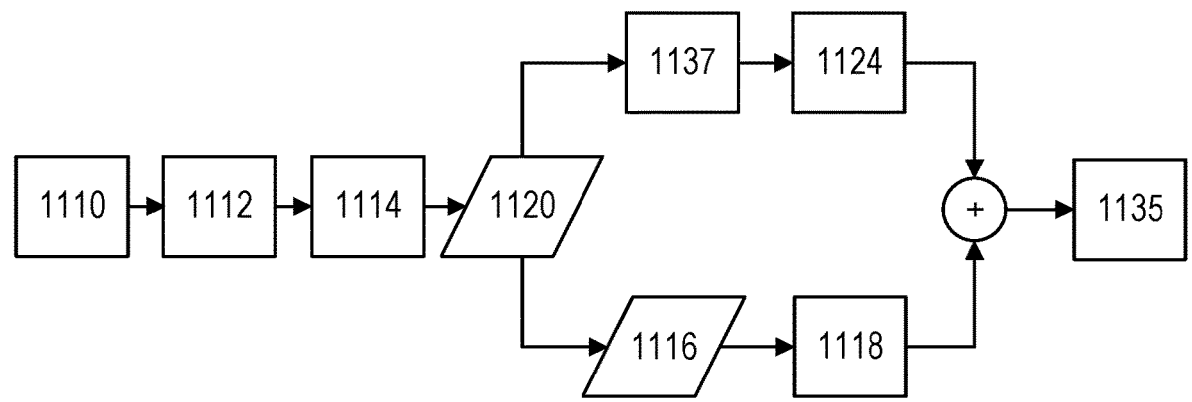

In the above examples, and in particular the method described in the flowchart of FIG. 9, only the global part of the fingerprints, more specifically high order global model 914 is mapped to the common layout. In a further embodiment, it is proposed that this method is varied to also map the field-to-field variation terms. The fundamental problem in mapping the field-to-field variation terms in this context is that the field centers and dimensions are typically different for the different layouts. Two possible methods for addressing this are illustrated in FIGS. 11(*a*) and 11(*b*) respectively. In both cases, the method steps depicted may be in place of steps 910-926 of FIG. 9, with steps 1110, 1112 and 1114 largely corresponding to steps 910, 912 and 914 respectively. However, in addition to the global model (and optionally wafer edge model), block 1114 may also comprise a Correction Per Exposure (CPE) model. CPE is an (e.g., 6-parameter) model which determines a correction for every exposed field, to reduce the field-to-field variation.

In FIG. 11(*a*), the target layout which is being mapped to is converted to an intermediate layout 1134 which is a subset of the full target layout. The input layout 1110 may be the first layout, second layout or any other layout. The target layout may be the common layout; or alternatively the second layout (when directly mapping to the first layout from the second layout) or the first layout (when directly mapping to the second layout from the first layout).

More specifically, the input layout 1110 may be the first layout or second layout and the intermediate layout 1134 may be the common layout in the context of the above. The intermediate layout 1134 may comprise the measurement locations from the target layout 1134 but with the field dimension and field centers from the input or first layout. In this method, the model parameters (correctable errors) 1120 including the intra-field fingerprints (associated with CPE corrections) are mapped 1132 directly to the intermediate layout. For, the residual (non-correctable errors) 1116, an interpolation 1133 is used to map it to the same intermediate layout 1134. The results of the mappings are combined into a fingerprint in this intermediate layout 1134, to which corrections from the input layout 1110 can be applied. The benefit of this method is that the loss of spatial information is small; however it has the drawback that there is a loss of measurement points in the intermediate layout 1134. Additionally, this method is prone to overfitting at wafer edge fields due to the small number of points per field.

FIG. 11(*b*) shows a mapping of the intra-field fingerprints (associated with CPE) using 'reverse refinement'. The CPE correctable error 1120 from the input layout 1110 is converted from a first function, being a function of field center coordinates to a second function, which is a function of wafer center coordinates. This conversion may be performed by re-modeling 1137 the correctable error 1120 with a very high order global model, such as a radial basis function (RBF), and then mapping 1124 to the target layout 1135. RBF modeling is described in published patent application US 2012/0218533, which is incorporated herein by reference. The non-correctable element 1116 is treated much the same as other examples: i.e., an interpolation 1118 is used to map it to the target layout 1135. In this method we lose some spatial information, but there is no need to construct an intermediate layout or common layout; i.e., in this method the input layout 1110 may be the first layout and the target layout 1135 may be the second layout (or vice versa). The method of this embodiment has the inherent advantage of reduced overfitting of noise at wafer edge.

Correction Per Exposure (CPE) related data is an important part in anchor fingerprint determination in computational overlay. The CPE content is layout (grid) dependent. If CPE determined from one layout is applied to a different layout, it is possible there will be a deterioration in accuracy; and any final gain in computational overlay accuracy may turn out to be negligible. In fact, it is not possible to use monitor wafers read out on another (standard) layout and determine the CPE content to be applied on a optimization module (e.g., half-field overlay optimizer) or product layout.

The layout used for monitor wafers is a standard layout specifically targeted for controlling drift within the scanner tool. As has already been described, when different layers are exposed with different scanner types, a consequent (additional) overlay error may be incurred. In addition to this, since monitor wafers are exposed on a different layout than the product, and are not subject to the same process steps as the product wafers, there are resultant overlay errors introduced which cannot be captured and corrected for using the scanner stability module previously described. An (e.g., overlay) optimization module could be used to make further corrections by using after-etch inspection (AEI) or after-develop inspection (ADI) measurements. However, the stability module and optimization module determine corrections on different levels which are independent. Therefore, separate overlay metrology needs to be done respectively for both of these modules.

The overlay optimization module may comprise a software module which determines static and dynamic overlay optimization corrections in a feedback loop based on (e.g., sparsely measured) in-line ADI metrology, which may be measured per-lot for example, and (e.g., densely measured) off-line (e.g., static) AEI metrology. As such, the metrology for the optimization module (AEI overlay and ADI overlay) should identify static and per lot corrections to feed back to the scanner, in order to improve on-product overlay. The model for the optimization module may require a minimum number of points per field in the region of 50 ppf (points-per-field); this is an expensive measurement, particularly if it needs to be performed per lot for some, or even all, wafers.

Monitor wafers are measured frequently for scanner drift control after exposure: i.e., ADI. It is proposed here to use these measurements for on-product overlay AEI improvements, together with some indicators of the physical principles of the scanner comprised within the optimization module correctable model contents. In this way the metrology time can be significantly reduced. Furthermore, such an approach may help to improve accuracy in computational overlay, by improving the signal to noise ratio of the model parameters which originate from the scanner physical principles in exposure sequences. Such an approach proposes a combined stability monitor and overlay optimizer scheme with reduced metrology time, improved accuracy in computational overlay, while using scanner data contribution.

It is proposed to use monitor wafer data (stability module data) plus, for example, on-product wafer data for per-field correction purposes in a computational overlay context: only the field-layout-independent components of the scanner overlay contribution is used in the per-field overlay reconstruction process.

Such a method may comprise the following steps:
1. Decorrect overlay data for Scanner Baseline Constants (SBC) correction (i.e., remove or undo SBC correction from the overlay data). Traditionally, optical lithography systems are controlled by many numerical parameters known as Machine Constants (MCs). MCs are typically generated by a lithography system during in situ or other system based tests that generate and optimize the MCs for a very specific test condition set. The scanner stability module uses SBCs. The concept of SBCs introduces a "middle layer" of offsets which forces tools to be closely matched to one another under general lithography conditions, not just the specific test conditions used for MC generation.
2. Determine overlay model variables (e.g., k-parameters) as applied on the decorrected overlay, for different field layouts (monitor wafer and product wafer).
3. Select the overlay model variables which are the most invariant or substantially invariant to field layout; these parameters reflect scanner contribution, and stability data can be modeled to these parameters for computational overlay/CPE purposes.
4. The method of obtaining and applying noise free correctable content can be considered independent of the different types of fields (e.g.; edge, center, scan up, scan down, scan left, scan right).

In this manner, the content of layout independent CPE correctable errors for different wafer layouts (e.g., stability monitoring standard layout, stability monitoring standard half field layout and/or product layout). This procedure can help identify the k-parameters or overlay model variables with the lowest layout dependency, which may be used for corrections at CPE level. If these overlay model variables are used, improvements in computational overlay accuracy of ~0.1 nm-~0.2 nm may be achieved.

This methodology shows that sometimes correlations in only higher order k-parameters are observed and therefore using a higher order model may provide the highest value. Such a conclusion would have not been possible without the methodology proposed. Furthermore, this technique indicates that there are scan directions (scan up/down/left/right) and radial dependencies (full fields within 130 mm of wafer radius and all fields 130 mm-150 mm) in the selected k-parameters. Therefore, it is proposed to segregate the k-parameters accordingly. Moreover, the proposed method is applicable for any scanner combinations, e.g., including when different tools are used to expose different layers (e.g., machine-machine matching or cross platform matching).

Embodiments provide lithographic performance matching without additional cost or time, while the accuracy is good for matching. Recurrent monitoring for stability control is normally performed every 3 days for each scanner at semiconductor manufacturing site. Therefore, it can be used for monitoring purposes and to inform semiconductor manufacturers about optimal scanner-to-scanner pairing.

In another embodiment the difference between first grid data of a first lithographic apparatus and second grid data of a second lithographic apparatus is modeled. Typically the grid data is associated with (overlay) grid measurements performed on substrates relating to monitoring the status of the first and second lithographic apparatus (e.g. referred to as monitoring data).

The modeled difference may be used to calculate an offset between the grids (associated with position control of providing features to substrates) of said first and second lithographic apparatus. The offset may be expressed as a deviation from a nominal grid associated with respectively the first and second lithographic apparatus.

Additionally a grid offset recipe may be generated for the first and/or second lithographic apparatus. The grid offset recipe is configured to control the lithographic apparatus such that layers on a substrate patterned by said first lithographic apparatus are better matched to previous or subsequent layers on the substrate patterned by said second lithographic apparatus.

In an example the matching relates to a fingerprint of a distortion component (e.g. for example related to an overlay error) across an average exposure field on the substrate. This is generally referred to as matching of intra-field behavior (intra-field content of the substrate fingerprint). In another example the matching relates to inter-field fingerprint content; e.g. the part of the fingerprint that varies between individual exposure field. Hence the grid offset may be associated with the intra-field and/or inter-field contents of the (overlay/distortion) fingerprint across the substrate.

The calculated offset between grids may further be used in controlling overlay during patterning operations performed by the first and/or second lithographic apparatus. During the determinization of actuator setpoints, for example based on available overlay measurement data (associated with previously exposed substrates), the offset may be used as a further input. Hence the determined offset between the grids may be used in determining an overlay correction for said first and/or second lithographic apparatus. The advantage is that the obtained overlay correction then takes a required matching criterion associated with differences in grid between the first and second lithographic apparatus into account.

The first and second lithographic apparatus may be of a different type, for example a first lithographic apparatus being a DUV scanner and the second lithographic apparatus being an EUV scanner.

The first lithographic apparatus may have a larger overlay correction potential than the second lithographic apparatus, for example due to the availability of a higher order overlay correction interface and/or hardware related differences such as the availability of higher order projection lens manipulators allowing better control of distortion components along the length and/or width of the exposure field.

It is preferred to use the grid offset data (e.g. recipe for example) in controlling/configuring the lithographic apparatus with the largest correction potential. As more correction potential is available also the matching potential will be larger and a better matching quality between the lithographic apparatuses will be achieved.

Typically the grid data of the first and second lithographic apparatus is obtained by analysis of monitoring data generated during exposure and readout of reference substrates patterned by the lithographic apparatus of interest. Typically the reference substrates comprise pre-patterned features (normally target features etched into the substrate at known positions). The reference substrates are provided with a layer of photoresist and subsequently the photoresist layer is patterned by the lithographic apparatus of interest. The positional deviations between the pre-patterned features and features within the patterned photoresist layer are used to obtain monitoring data being representative of the grid of the lithographic apparatus of interest.

In an embodiment a method is provided for determining a lithographic matching performance between a first lithographic apparatus and a second lithographic apparatus, wherein the method comprises modeling the difference between first grid measurements associated with the first lithographic apparatus and second grid measurements associated with the second lithographic apparatus.

In an embodiment the method further comprises using the modeled difference in configuring the first and/or second lithographic apparatus.

In an embodiment the configuring comprises defining an offset with respect to a nominal grid definition associated with said first and/or second lithographic apparatus.

In an embodiment the configuring comprises generation of a recipe for the first and/or second lithographic apparatus, wherein the recipe defines an offset with respect to a nominal grid definition associated with said first and/or second lithographic apparatus.

In an embodiment the modeling is configured to describe intra-field and/or inter-field content comprised within the modeled difference.

In an embodiment the lithographic apparatus having the largest correction potential is configured and/or controlled.

In an embodiment the correction potential is associated with reducing a difference between the first and the second grid measurements.

In an embodiment the first lithographic apparatus is a Deep UV (DUV) lithographic apparatus and the second lithographic apparatus is an Extreme UV (EUV) lithographic apparatus.

In an embodiment the method further comprises determining an overlay correction for said first and/or second lithographic apparatus using the offset.

The scope of this method is not limited to EUV to DUV matching. It can also be used for DUV to DUV and EUV to EUV matching, for example if different monitor wafer layouts are used for the same platform, as long as there is recurrent monitoring for stability control (drift control) being used.

Embodiments may be implemented in a semiconductor manufacturing process comprising a method for determining lithographic matching performance described with reference to FIGS. 8 to 10.

Embodiments may be implemented in a lithographic apparatus, such as described with reference to FIG. 1, comprising:
- an illumination system configured to provide a projection beam of radiation;
- a support structure configured to support a patterning device, the patterning device configured to pattern the projection beam according to a desired pattern;
- a substrate table configured to hold a substrate;
- a projection system configured the project the patterned beam onto a target portion of the substrate; and
- a processing unit configured to determine a correction to a process according to a method described with reference to FIGS. 8 to 10.

Embodiments may be implemented in a lithographic apparatus, such as described with reference to FIG. 2.

Embodiments may be implemented in a computer program product comprising machine readable instructions for causing a general-purpose data processing apparatus to perform the steps of a method described with reference to FIGS. 8 to 10.

Further embodiments are disclosed in the list of numbered clauses below:

1. A method of determining lithographic matching performance between lithographic apparatuses for semiconductor manufacture, the method comprising the steps:
   - obtaining first monitoring data from recurrent monitoring for stability control of a first lithographic apparatus;
   - obtaining second monitoring data from recurrent monitoring for stability control of a second lithographic apparatus;
   - determining a lithographic matching performance between the first lithographic apparatus and the second lithographic apparatus based on the first monitoring data and the second monitoring data.
2. The method of clause 1, wherein:
   - the first monitoring data are in a first layout;
   - the second monitoring data are in a second layout; and
   - the step of determining a lithographic matching performance comprises reconstructing at least one of the first and second monitoring data into a common layout to allow comparison of the first and second monitoring data.
3. The method of clause 2, wherein the step of reconstructing comprises fitting the respective monitoring data to at least one model of a lithographic process of the respective lithographic apparatus to predict reconstructed monitoring data in the common layout.
4. The method of clause 3, wherein the step of reconstructing further comprises mapping fitted parameters of the model to the common layout.
5. The method of clause 3 or 4, wherein the step of reconstructing further comprises interpolating residuals from the fitting to the common layout.
6. The method of any of clauses 2 to 5, wherein the at least one model comprises at least a global model to determine global corrections per substrate and an intra-field model to enable corrections per exposure.
7. The method of clause 6, comprising mapping from one of the first layout or second layout to the common layout, said common layout comprising the field dimension and field centers from the other of the first layout or second layout.
8. The method of any of clauses 2 to 5, wherein the at least one model comprises at least a global model to determine global corrections per substrate and an intra-field model to enable corrections per exposure and the method further comprises: converting a correctable error related to the intra-field model in one of the first layout or second layout from being a function of field center coordinates to a function of wafer center coordinates prior to being mapped to the other of the first layout or second layout; the method not necessarily comprising the step of reconstructing at least one of the first and second monitoring data into a common layout.
9. The method of clause 8, comprising wherein the converting step comprises by re-modeling the correctable error using a very high order global model.
10. The method of clause 9, wherein the very high order global model comprises radial basis function.
11. The method of any preceding clause, wherein the monitoring data comprise inter-field data corresponding to a plurality of lithographic exposure fields.
12. The method of any preceding clause, wherein the monitoring data comprise intra-field data corresponding to a lithographic exposure field.
13. The method of clause 12 further comprising processing the inter-field data separately from the intra-field data.
14. The method of clause 13, further comprising combining the separately processed inter-field and intra-field data to allow comparison of the first and second monitoring data in a common layout.
15. The method of any preceding clause, wherein the lithographic matching performance comprises overlay matching performance.
16. The method of any preceding clause, wherein the monitoring data comprise a grid of overlay measurements.
17. The method of any preceding clause, wherein the monitoring data comprise a wafer map.
18. The method of any preceding clause, wherein the monitoring data are obtained by measuring one or more monitoring substrates periodically processed on the respective lithographic apparatus.
19. The method of clause 18, wherein the first monitoring data is obtained from exposures of the one or more monitoring substrates that were contemporaneous with exposure of one or more substrate to be exposed in the second lithographic apparatus depending on the determination of the lithographic matching performance.
20. A method for modeling performance data of a substrate subject to a lithographic process, the method comprising: obtaining performance data associated with the substrate; mapping the performance data to a first layout of exposure fields to obtain first performance data and to a second layout of exposure fields to obtain second performance data; applying a model comprising a plurality of parameters to the first performance data to obtain a first set of parameter values and to the second performance data to obtain a second set of parameter values; and selecting one or more parameters out of the plurality of parameters based on its value corresponding to the first set of parameter values compared to its value corresponding to the second set of parameter values.

21. A method as claimed in claim 20, wherein said selecting one or more parameters comprises selecting said parameters based on their invariance to layout.

22. A method as claimed in claim 21, wherein said selecting one or more parameters comprises selecting the one or more parameters which are the most invariant, or which are invariant according to a threshold, to layout.

23. A method as claimed in any of claims 20 to 22, wherein the model comprises an intra-field model to enable corrections per exposure.

24. A method as claimed in any of claims 20 to 23, wherein the first layout relates to monitoring substrates for stability control and the second layout relates to said model.

25. A method as claimed in any of claims 20 to 24, comprising performing said method independently for different types of field, where the different types of field are differentiated on one or both of substrate location or scan direction.

26. A semiconductor manufacturing process comprising a method for determining lithographic matching performance according to the method of any preceding clause.

27. A lithographic apparatus comprising:
    an illumination system configured to provide a projection beam of radiation;
    a support structure configured to support a patterning device, the patterning device configured to pattern the projection beam according to a desired pattern;
    a substrate table configured to hold a substrate;
    a projection system configured the project the patterned beam onto a target portion of the substrate; and
    a processing unit configured to determine lithographic matching performance according to the method of any of clauses 1 to 25.

28. A lithographic cell comprising the lithographic apparatus of clause 27.

29. A computer program product comprising machine readable instructions for causing a general-purpose data processing apparatus to perform the steps of a method according to any of clauses 1 to 25.

30. The method of clause 16, wherein the determining of the lithographic matching performance between the first lithographic apparatus and the second lithographic apparatus comprises modeling the difference between first grid measurements associated with the first lithographic apparatus and second grid measurements associated with the second lithographic apparatus.

31. The method of clause 30, further comprising using the modeled difference in configuring the first and/or second lithographic apparatus.

32. The method of clause 31, wherein the configuring comprises defining an offset with respect to a nominal grid definition associated with said first and/or second lithographic apparatus.

33. The method of clause 31, wherein the configuring comprises generation of a recipe for the first and/or second lithographic apparatus, wherein the recipe defines an offset with respect to a nominal grid definition associated with said first and/or second lithographic apparatus.

34. The method of any of clauses 30 to 33, wherein the modeling is configured to describe intra-field and/or inter-field content comprised within the modeled difference.

35. The method of any of clauses 31 to 34, wherein the first lithographic apparatus is configured, and wherein the first lithographic apparatus has more correction potential than the second lithographic apparatus.

36. The method of clause 35, wherein the correction potential is associated with reducing a difference between the first and the second grid measurements.

37. The method of clause 35 or 36, wherein the first lithographic apparatus is a Deep UV (DUV) lithographic apparatus and the second lithographic apparatus is an Extreme UV (EUV) lithographic apparatus.

38. The method of any of clauses 32 to 37, further comprising determining an overlay correction for said first and/or second lithographic apparatus using the offset.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a characteristic of the structure on the substrate may relate to defects in the structure, the absence of a specific part of the structure, or the presence of an unwanted structure on the substrate, for example.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of physical systems such as structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of a physical structure may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of determining lithographic matching performance between lithographic apparatuses for semiconductor manufacturing, the method comprising:
    obtaining first monitoring data in a first layout from recurrent monitoring for stability control of a first lithographic apparatus;
    obtaining second monitoring data in a second layout from recurrent monitoring for stability control of a second lithographic apparatus; and
    determining a lithographic matching performance between the first lithographic apparatus and the second lithographic apparatus based on the first monitoring data and the second monitoring data, wherein the determining comprises reconstructing, by a hardware computer system, the first and/or second monitoring data into a common spatial layout to allow comparison of the first and second monitoring data.

2. The method of claim 1, wherein the reconstructing comprises fitting the respective first and/or second monitoring data to a model of a lithographic process of the respective first and/or second lithographic apparatus to predict reconstructed monitoring data in the common layout.

3. The method of claim 2, wherein the reconstructing further comprises mapping fitted parameters of the model to the common layout.

4. The method of claim 2, wherein the reconstructing further comprises interpolating residuals from the fitting to the common layout.

5. The method of claim 1, wherein the first and/or second monitoring data comprises inter-field data corresponding to a plurality of lithographic exposure fields and intra-field data corresponding to a specific lithographic exposure field.

6. The method of claim 5, further comprising processing the inter-field data separately from the intra-field data.

7. The method of claim 6, further comprising combining the separately processed inter-field and intra-field data to allow comparison of the first and second monitoring data in a common layout.

8. The method of claim 1, wherein the lithographic matching performance comprises overlay matching performance and the first and/or second monitoring data comprises a grid of overlay measurements.

9. The method of claim 8, wherein the determining of the lithographic matching performance between the first lithographic apparatus and the second lithographic apparatus comprises modeling a difference between a first grid of overlay measurements associated with the first lithographic apparatus and a second grid of overlay measurements associated with the second lithographic apparatus.

10. The method of claim 9, further comprising using the modeled difference in configuring the first and/or second lithographic apparatus.

11. The method of claim 10, wherein the configuring comprises defining an offset with respect to a nominal grid definition associated with the first and/or second lithographic apparatus.

12. The method of claim 10, wherein the first lithographic apparatus is configured, and wherein the first lithographic apparatus has more correction potential than the second lithographic apparatus.

13. The method of claim 1, wherein the first and/or second monitoring data is obtained by measuring one or more monitoring substrates periodically processed on the respective first and/or second lithographic apparatus.

14. The method of claim 13, wherein the first monitoring data is obtained from exposures of the one or more monitoring substrates that were contemporaneous with exposure of one or more substrates to be exposed in the second lithographic apparatus depending on the determination of the lithographic matching performance.

15. A non-transitory computer program product comprising machine readable instructions therein, the instructions, when executed by a general-purpose data processing apparatus, configured to cause the general-purpose data processing apparatus to at least:
    obtain first monitoring data in a first layout from recurrent monitoring for stability control of a first lithographic apparatus;
    obtain second monitoring data in a second layout from recurrent monitoring for stability control of a second lithographic apparatus; and
    determine a lithographic matching performance between the first lithographic apparatus and the second lithographic apparatus based on the first monitoring data and the second monitoring data, wherein the determination of the lithographic matching performance comprises reconstruction of the first and/or second monitoring data into a common spatial layout to allow comparison of the first and second monitoring data.

16. The computer program product of claim 15, wherein the reconstruction comprises fitting of the respective first and/or second monitoring data to a model of a lithographic process of the respective first and/or second lithographic apparatus to predict reconstructed monitoring data in the common layout.

17. The computer program product of claim 16, wherein the reconstruction further comprises mapping of fitted parameters of the model to the common layout.

18. The computer program product of claim 16, wherein the reconstruction further comprises interpolation of residuals from the fitting to the common layout.

19. The computer program product of claim 15, wherein the monitoring data comprises inter-field data corresponding to a plurality of lithographic exposure fields and intra-field data corresponding to a specific lithographic exposure field.

20. The computer program product of claim 19, wherein the instructions are further configured to cause the general-purpose data processing apparatus to process the inter-field data separately from the intra-field data.

* * * * *